US010748571B2

(12) United States Patent
Tanaka et al.

(10) Patent No.: US 10,748,571 B2
(45) Date of Patent: Aug. 18, 2020

(54) MECHANICALLY BALANCED AND MAGNETICALLY UNBALANCED DEVICE

(71) Applicant: Seagate Technology LLC, Cupertino, CA (US)

(72) Inventors: Samuel Lewis Tanaka, San Leandro, CA (US); ChunWai Joseph Tong, San Jose, CA (US); Xiaoding Ma, Fremont, CA (US); Jerry Kueirweei Chour, Fremont, CA (US); Thomas Larson Greenberg, Berkeley, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 204 days.

(21) Appl. No.: 15/876,062

(22) Filed: Jan. 19, 2018

(65) Prior Publication Data
US 2019/0051327 A1   Feb. 14, 2019

Related U.S. Application Data

(60) Provisional application No. 62/543,271, filed on Aug. 9, 2017.

(51) Int. Cl.
| | | |
|---|---|---|
| *H01J 37/34* | (2006.01) | |
| *G11B 5/851* | (2006.01) | |
| *G11B 5/73* | (2006.01) | |
| *H01F 1/06* | (2006.01) | |
| *G11B 5/65* | (2006.01) | |
| *C23C 14/34* | (2006.01) | |
| *G11B 5/012* | (2006.01) | |
| *H01F 41/18* | (2006.01) | |
| *C23C 14/18* | (2006.01) | |
| *C23C 14/35* | (2006.01) | |
| *G11B 5/00* | (2006.01) | |

(52) U.S. Cl.
CPC ............ *G11B 5/851* (2013.01); *C23C 14/185* (2013.01); *C23C 14/3421* (2013.01); *C23C 14/35* (2013.01); *G11B 5/012* (2013.01); *G11B 5/656* (2013.01); *G11B 5/7325* (2013.01); *H01F 1/068* (2013.01); *H01F 41/18* (2013.01); *H01J 37/345* (2013.01); *G11B 2005/0021* (2013.01)

(58) Field of Classification Search
CPC ... C23C 14/185; C23C 14/3421; C23C 14/35; C23C 14/352; H01J 37/345; G11B 5/851; G11B 5/7325; G11B 5/656; G11B 5/012; G11B 2005/0021; H01F 1/068; H01F 41/18
USPC .............................. 204/298.19, 298.2, 192.2
See application file for complete search history.

(56) References Cited

U.S. PATENT DOCUMENTS

| | | | | |
|---|---|---|---|---|
| 6,440,282 B1 * | 8/2002 | Wada | .................. | H01J 37/3408 204/298.17 |
| 7,736,473 B2 | 6/2010 | Miller et al. | | |
| 7,838,135 B2 * | 11/2010 | Kuo | ...................... | C23C 14/025 428/829 |
| 8,173,282 B1 * | 5/2012 | Sun | ......................... | G11B 5/65 204/192.1 |

(Continued)

*Primary Examiner* — Rodney G McDonald
(74) *Attorney, Agent, or Firm* — Holzer Patel Drennan

(57) ABSTRACT

A device includes a housing unit and a number of magnets. The housing unit includes a number of holes therein. The magnets are positioned in the holes. The magnets have a same pole orientation. It is appreciated that the magnets are positioned in the holes to form a mechanically balanced and magnetically unbalanced structure.

20 Claims, 11 Drawing Sheets

(56) References Cited

U.S. PATENT DOCUMENTS

| | | |
|---|---|---|
| 8,685,215 B2 | 4/2014 | Miller et al. |
| 9,082,595 B2 | 7/2015 | Dekempeneer et al. |
| 9,494,869 B2 | 11/2016 | Butler et al. |
| 2002/0195336 A1* | 12/2002 | Glocker ................ C23C 14/352 204/298.19 |

* cited by examiner

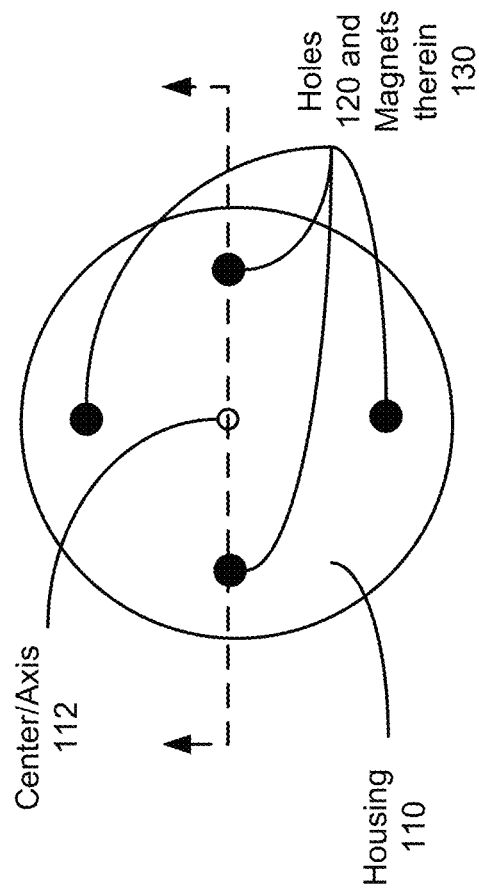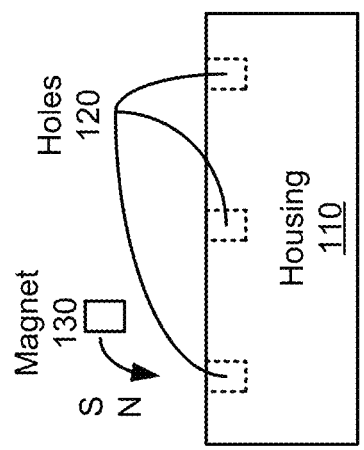

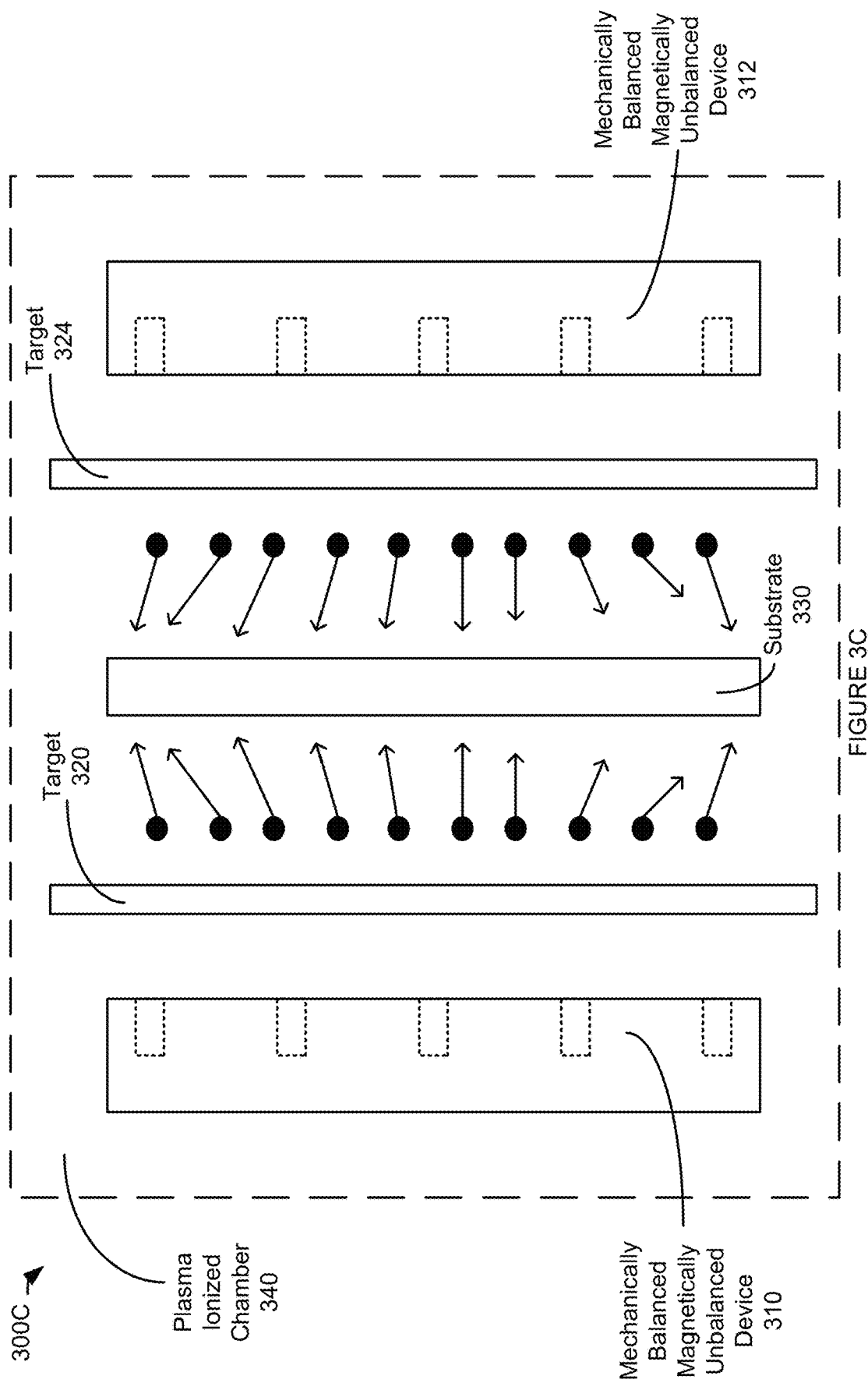

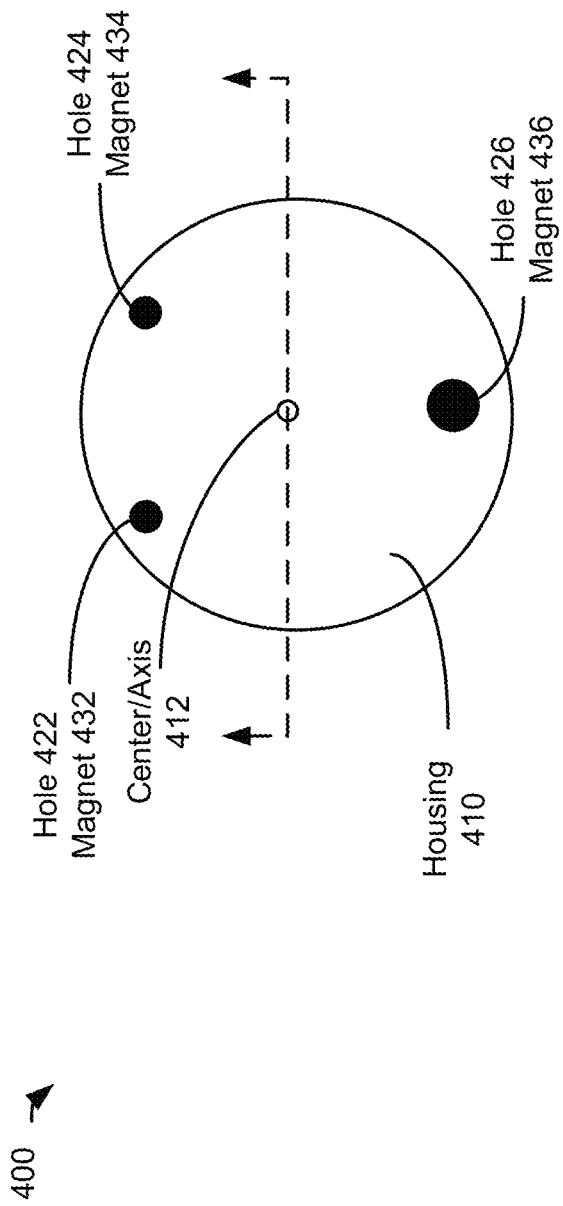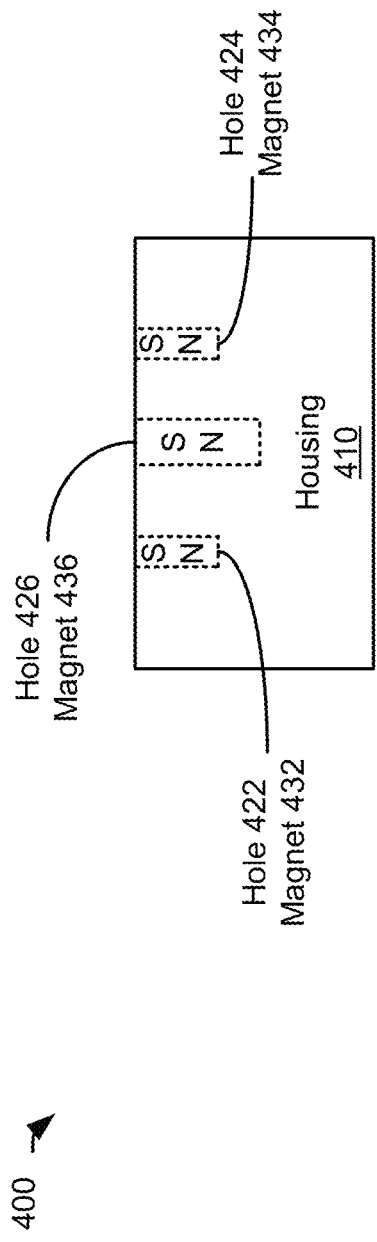

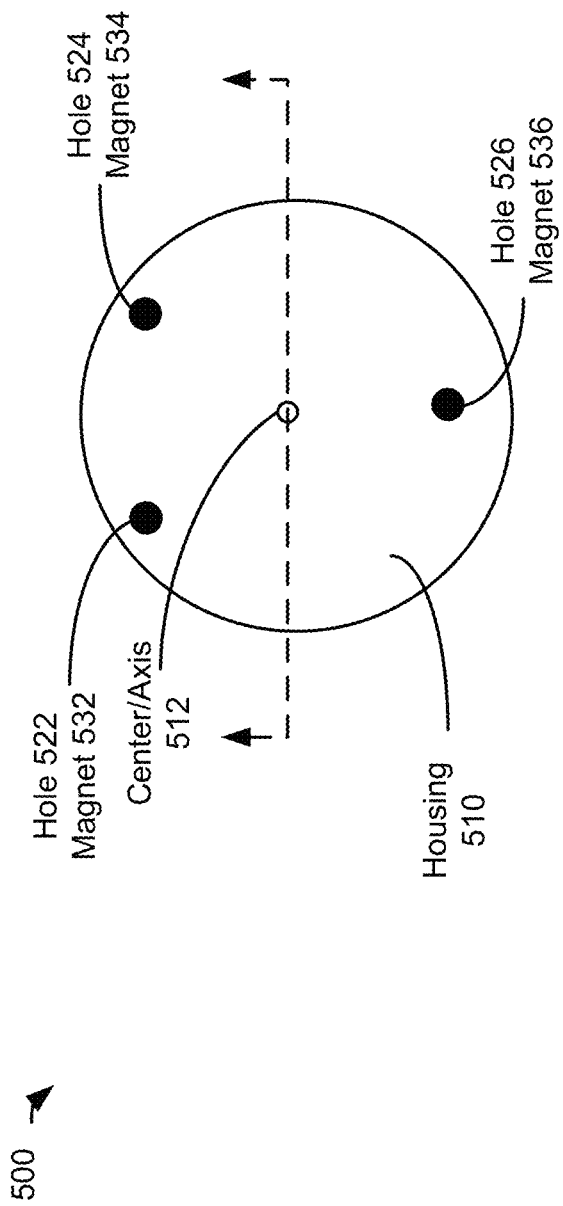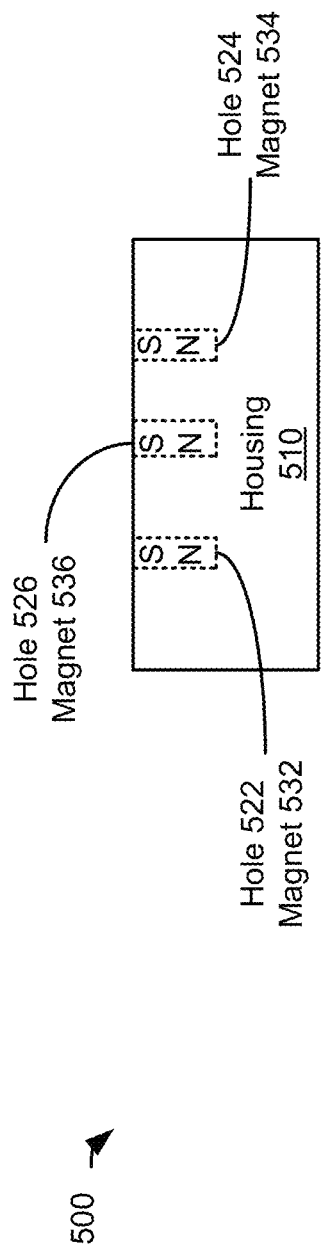

MECHANICALLY BALANCED AND MAGNETICALLY UNBALANCED DEVICE

RELATED

This application claims the benefit and priority to the U.S. Provisional Patent Application No. 62/543,271, filed on Aug. 9, 2017, which is hereby incorporated by reference in its entirety.

SUMMARY

Provided herein is device including a housing unit and a number of magnets. The housing unit includes a number of holes therein. The magnets are positioned in the holes. The magnets have a same pole orientation. It is appreciated that the magnets are positioned in the holes to form a mechanically balanced and magnetically unbalanced structure. These and other features and advantages will be apparent from a reading of the following detailed description.

BRIEF DESCRIPTION OF DRAWINGS

FIGS. 1A-1B show an exemplary top and side views of a mechanically balanced and magnetically unbalanced device according to one aspect of the present embodiments.

FIGS. 3A-3C show mechanically balanced and magnetically unbalanced devices according to one aspect of the present embodiments.

FIGS. 4A-4B show an exemplary top and side views of unsymmetrical but mechanically balanced and magnetically unbalanced device with different dimension magnets according to one aspect of the present embodiments.

FIGS. 5A-5B show another exemplary top and side views of unsymmetrical but mechanically balanced and magnetically unbalanced device with same dimension magnets and different mass according to one aspect of the present embodiments.

DESCRIPTION

Figure 2A:
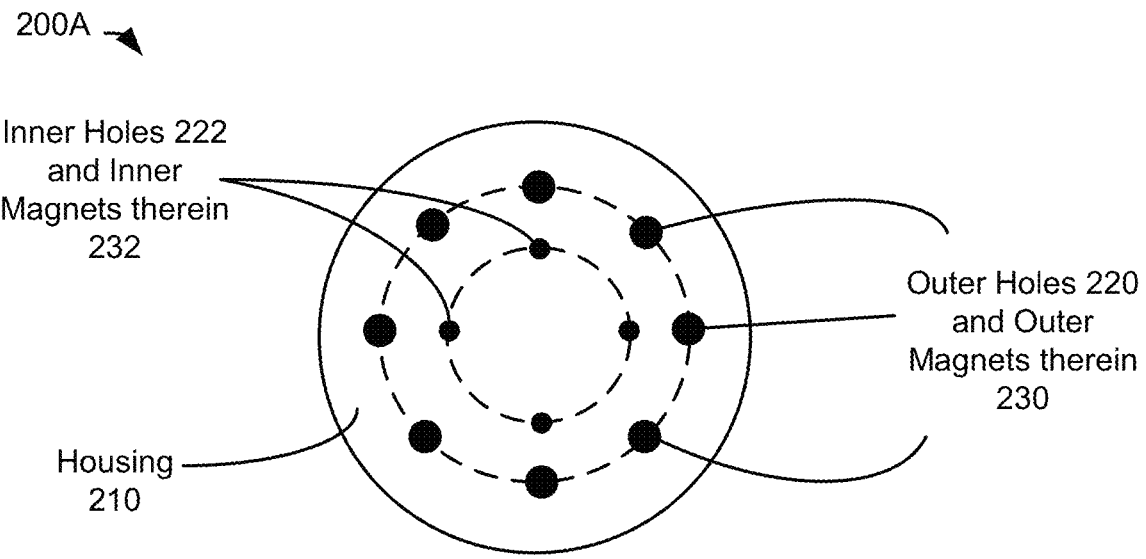
FIGS. 2A-2B show exemplary top views of mechanically balanced and magnetically unbalanced devices according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

In the hard drive industry, deployment of Heat Assisted Magnetic Recording (HAMR) technology includes a substrate material change to glass consistent with thermal transfer properties of the HAMR writing process. Material such as FePt or an alloy thereof is deposited for HAMR. However, deposition of material such as FePt is challenging. For example, the substrate that FePt is being deposited on is heated to a high temperature, e.g., approximately 500° C. in order to deposit the FePt. Conventionally, mechanically unbalanced magnets and magnetically balanced magnets were used to deposit FePt by rotating around the target to deposit FePt on the substrate. Proper orientation of FePt at high temperature is achievable. However, heating the substrate requires subsequent cooling which adversely impacts the throughput process as well as wasting energy. Unfortunately, proper magnetic ordering for FePt has not been achieved at a substantially lower temperature, e.g., approximately 300° C.

Accordingly, a desire has now arisen to deposit FePt on a substrate at a substantially lower temperature, e.g., approximately between 250° C.-350° C. Moreover, a need has arisen to deposit FePt at a lower temperature while achieving the proper ordering for magnetic recording property. In some embodiments, magnetically unbalanced and mechanically balanced magnets are used. It is appreciated that magnetically unbalanced and mechanically balanced magnets may be with respect to an axis, e.g., axis of rotation, axis perpendicular to the x-y plane of an apparatus comprising the magnets, etc.

In some embodiments a dual sided apparatus is used. The first side includes magnets that are magnetically unbalanced and mechanically balanced and are positioned on a first side of the substrate. The second side includes magnets that are magnetically unbalanced and mechanically balanced and are positioned on a second side of the substrate. In other words, the dual sided magnets sandwich the substrate. It is appreciated that magnets on the first side may be equidistance apart (e.g., arranged in a circular fashion, arranged in a two or more concentric circles, arranged in equilateral triangular fashion, arranged in two or more equilateral triangular fashion, etc.) from one another to be mechanically balanced and they may have the same N-S pole orientation in order to create magnetically unbalanced structure. It is appreciated that the magnets may be one magnet or a set of magnets stacked with the same pole orientation, e.g., two N—S magnets with the same pole orientation. It is appreciated that the magnets may be cylindrical in shape or cubical in shape. Similarly, it is appreciated that magnets on the second side may be similar to the magnets on the first side and operate substantially similar to those on the first side. In some embodiments, two targets are used. The first target may be positioned between the magnets on the first side and the first side of the substrate while a second target may be positioned between the magnets on the second side and the second side of the substrate. The two targets comprise FePt or an alloy thereof. The magnets on each side cause the FePt particles of the respective target to be deposited on a respective side of the substrate. It is appreciated that the FePt deposition may occur in a plasma ionized chamber. In some embodiments, the plasma ionized chamber changes the vibration frequency of the FePt atoms and the additional energy assists in proper ordering of the FePt layers in the HAMR stack.

It is appreciated that the magnetically unbalanced and mechanically balanced magnets result in FePt deposition on the substrate at a substantially lower temperature in comparison to the conventional process. For example, the deposition temperature may be reduced from 500° C. to between 250°-350° C. Moreover, the magnetically unbalanced and mechanically balanced magnets result in proper FePt ordering on the substrate suitable for HAMR media. Moreover, in some embodiments, the magnetic unbalanced and mechanically balanced magnets are stationary with respect to the substrate as opposed to a use of rotating magnets.

It is appreciated that while the embodiments are described with respect to the HAMR technology and deposition of FePt on glass, the embodiments are equally applicable to other materials in other technology areas. For example, similar embodiments may be employed in a semiconductor technology to deposit Transparent Conductive Oxide such as ITO, ZnO, etc., on crystalline silicon wafers. As such, references to deposition of FePt on glass for HAMR technology are for illustrative purposes and should not be construed as limiting the scope of the embodiments. For example, deposition may include deposition of material such as FePtX where X is Cu, Ag, CuAg, Mo, Co, Ni, etc.

Referring now to FIGS. 1A-1B, an exemplary top and side views of a mechanically balanced and magnetically unbalanced device 100 according to one aspect of the present embodiments are shown. The housing 110 may include a plurality of holes 120. One or more magnets 130 may positioned in one or more of the holes 120 to create a mechanically balanced device 100. For example, in some embodiments, the magnets 130 may have the same dimensions and may be made of the same material, therefore having a same mass, and positioned equidistance apart in the housing 110 in order to create a mechanically balanced device 100. In other words, the magnets 130 are positioned equidistance apart and create a mechanically balanced device 100 with respect to the center/axis 112 of the device.

It is appreciated that the magnets 130 are oriented to create a magnetically unbalanced device 100. For example, the magnets 130 may have a S-N orientation where S pole is facing away from the housing 110 and where N pole is facing inward to the housing 110. It is appreciated that the magnets 130 may be secured within the holes 120 of the housing 110 using different methods, e.g., fasteners, screws, glue, pressed, clamped, etc.

In some embodiments, the magnets 130 may be removable and replaceable such that for different applications different magnets in different holes can be used. For example, in some embodiments, as referenced with respect to FIG. 1A, the top and the bottom magnets 130 may be removed and replaced with magnets of a first magnetic strength while the right and the left magnets 130 may be removed and replaced with magnets of a second magnetic strength. Also, it is appreciated that in some embodiments, the housing 110 may include holes without any magnets. A housing 110 with a plurality of holes 120 that are not necessarily filled with magnets provide flexibility to create a reconfigurable device 100 that is mechanically balanced and magnetically unbalanced with different magnetic strengths.

It is appreciated that while the embodiments are described with respect to a circular housing, and circular/cylindrical magnets, the embodiments are not limited thereto. For example, the housing 110 may have any shape, e.g., rectangular. Moreover, the magnets may have any shape, e.g., cubical, etc. As such, the shape of the housing 110 and the magnets 130 should not be construed as limited to the embodiments described. It is also appreciated that the number of holes and magnets shown are for illustrative purposes and should not be construed as limiting the scope of the embodiments. Furthermore, it is appreciated that the number of holes and magnets shown to be equal is also for illustrative purposes and should not be construed as limiting the scope of the embodiments. For example, the housing 110 may include more holes 120 than magnets 130.

Figure 2B:
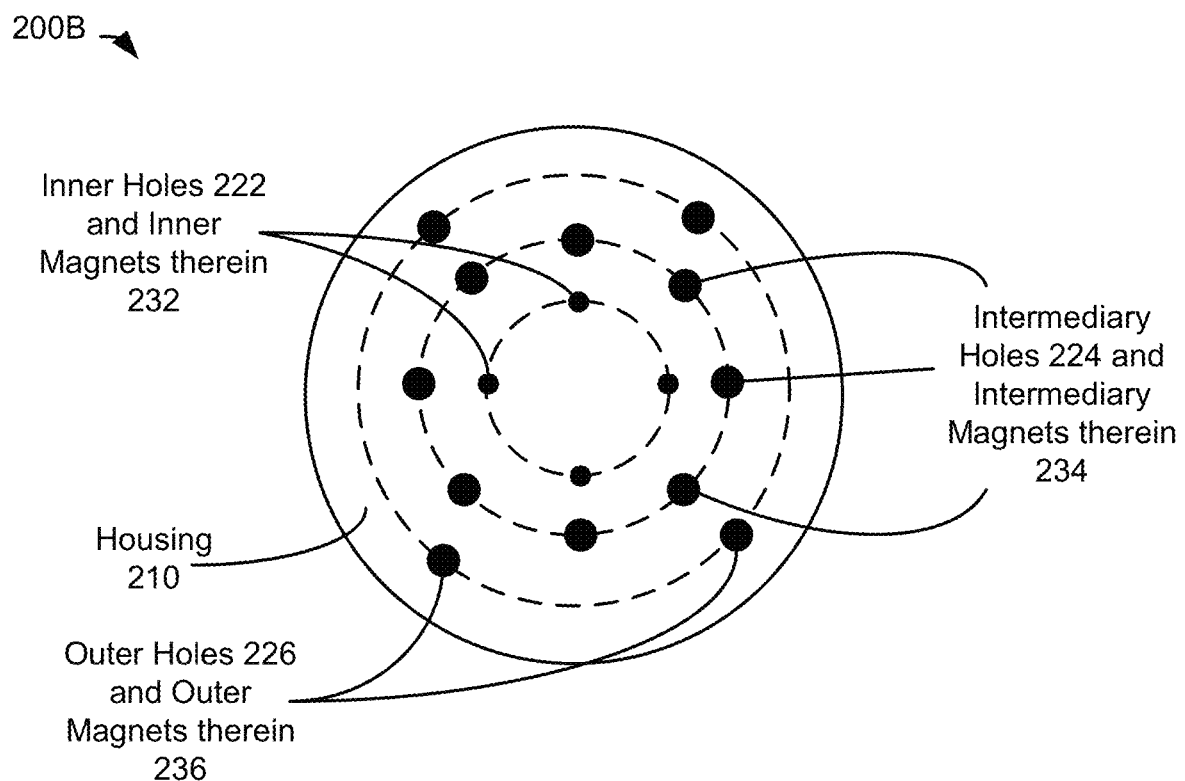

Referring now to FIG. 2A-2B, exemplary top views of mechanically balanced and magnetically unbalanced devices according to aspects of the present embodiments are shown. Referring explicitly to FIG. 2A, a mechanically balanced and magnetically unbalanced device 200A is shown. The mechanically balanced and magnetically unbalanced device 200A is similar to that of FIG. 1A and operates substantially similar to that of FIG. 1A. For example, the housing 210 is similar to the housing 110, the holes 220 are similar to holes 120, and the magnets 230 are similar to magnets 130, as described with respect to FIG. 1A. Device 200A, however, includes magnets 230, 232 and holes 220, 222 that are arranged in two concentric circles, e.g., inner circle and outer circle. For example, the device 200A includes outer holes 220 for positioning the outer magnets 230 on an outer concentric circle and may further include inner holes 222 for positioning the inner magnets 232 on an inner concentric circle.

Referring explicitly to FIG. 2B, the mechanically balanced and magnetically unbalanced device 200B is shown. Device 200B is similar to device 200A and functions substantially similar to that of FIG. 2A. Device 200B may include a third concentric circle for positioning the intermediary holes 224 and intermediary magnets 234 therein. It is appreciated that for each of the device 200A and 200B, the positioning of the holes and the magnets within the housing 210 creates a mechanically stable and magnetically unstable structure, as described with respect to FIGS. 1A-1B.

Figure 3A:
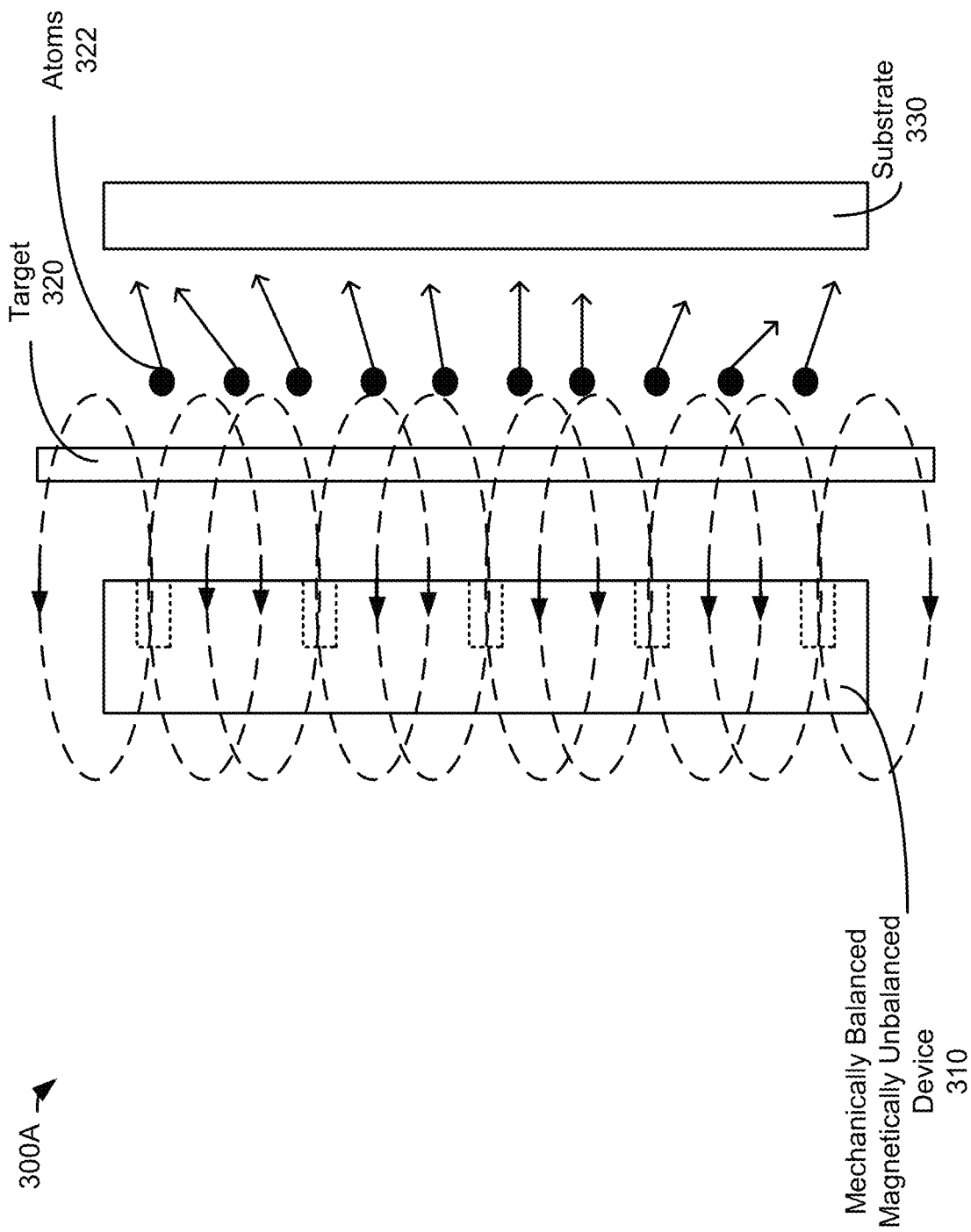
Figure 3B:
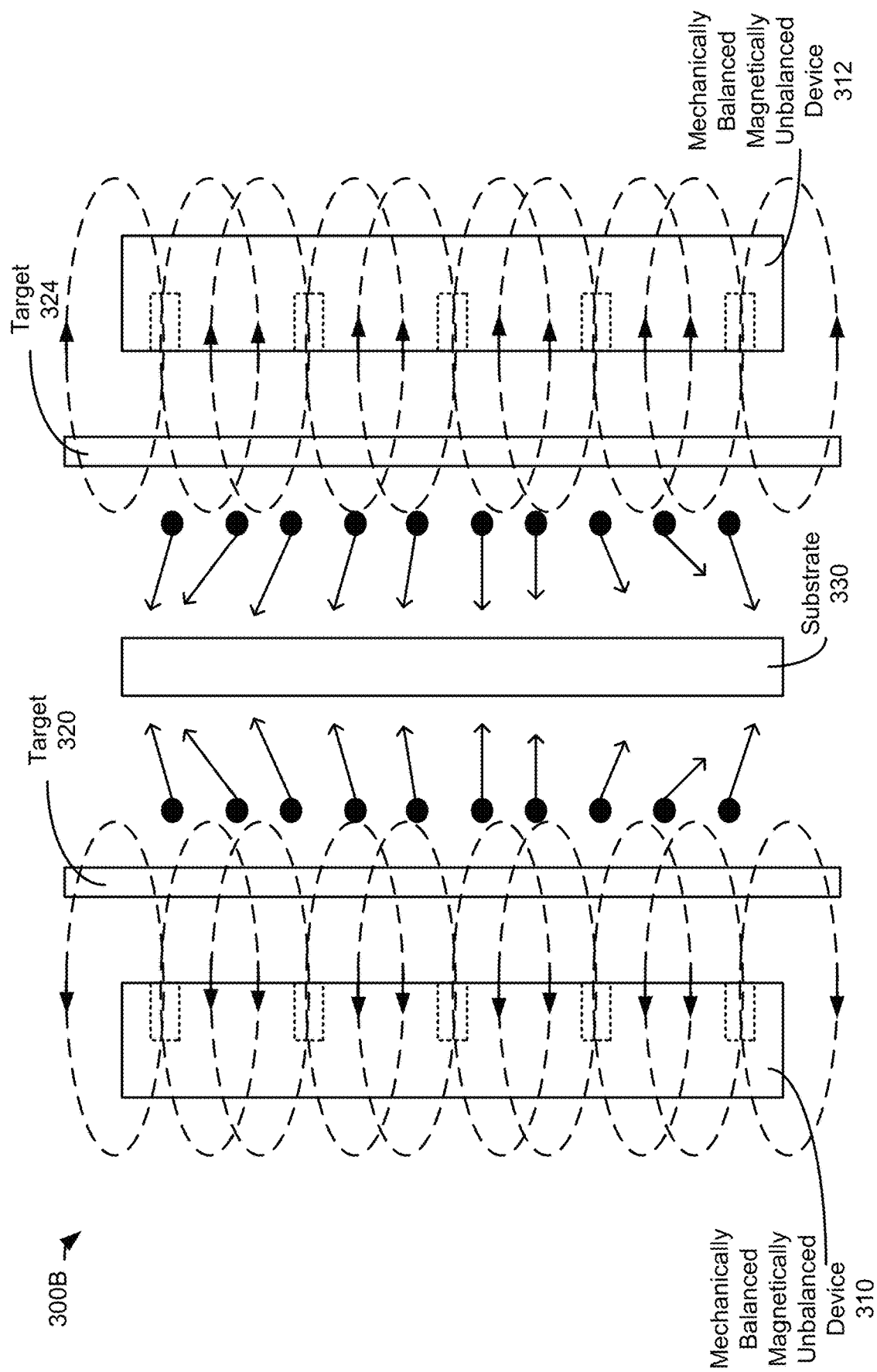

Referring now to FIGS. 3A-3C, mechanically balanced and magnetically unbalanced devices according to one aspect of the present embodiments are shown. More particularly referring to FIG. 3A, a system 300A according to some embodiments is shown. The system 300A includes a mechanically balanced and magnetically unbalanced device 310 similar to those described in FIGS. 1A-1B, and 2A-2B. The system 300A further includes a target 320 and a substrate 330. It is appreciated that the mechanically balanced and magnetically unbalanced device 310 may be stationary and it may generate unbalanced magnetic field, as shown by the dotted circular lines. The magnetic fields generated by the magnets of the mechanically balanced and magnetically unbalanced device 310 causes atoms and particles 322 from the target 320, comprising FePt or an alloy thereof, to be deposited onto the surface of the substrate 330 that faces the target 320. As a result of the mechanically balanced and magnetically unbalanced device 310, atoms 322 of the target 320 may be deposited on the substrate 330 at a much lower temperature in comparison to the conventional methods, e.g., mechanically unbalanced and magnetically balanced structures. For example, deposition can occur and the atoms 322 may be properly ordered as a face centered cubic (FCC) lattice at a temperature ranging from 250-350° C. instead of 500° C. In other words, a thermodynamically stable ordered state of $L1_0$ structure may be achieved at a much lower temperature. It is appreciated that in some embodiments, the target 320 may be FePtX where X is Cu, Ag, CuAg, Mo, Co, and Ni. It is appreciated that target 320 may further include sergeants such as B, C, SiC, BC, TiC, TaC, BN, SiN, TiN, $SiO_2$, $B_2O_3$, $WO_3$, $Ta_2O_5$, and $TiO_2$.

Referring now to FIG. 3B, a system 300B in accordance with some embodiments is shown. System 300B is substantially similar to that of FIG. 3A except that a second mechanically balanced and magnetically unbalanced device 312 and a second target 324 are positioned on a second side of the substrate 330. In other words, the mechanically balanced and magnetically unbalanced 310 device and the target 320 sandwich the substrate 330 from one side while the mechanically balanced and magnetically unbalanced 312 device and the target 324 sandwich the substrate 330 from another side. System 300B enables deposition on both sides of the substrate 330 simultaneously. It is appreciated that the mechanically balanced and magnetically unbalanced device 312 is substantially similar to those described in FIGS. 1A-1B, 2A-2B, and FIG. 3A and operates similar to the mechanically balanced and magnetically unbalanced devices described above.

It is appreciated that while the mechanically balanced and magnetically unbalanced devices 310 and 312 operate similar to one another, they might be configured differently. For example, the mechanically balanced and magnetically unbalanced device 310 may have a different number of holes and magnets in comparison to the mechanically balanced and magnetically unbalanced device 312. Moreover, it is appreciated that the two mechanically balanced and magnetically unbalanced devices 310 and 312 may have holes that have different dimensions and/or positioned differently in their respective housings, magnets that have different dimensions and/or magnets that have different composition and/or mass, or any combination thereof. It is further appreciated that the target 320 may be different from target 324. In other words, the target 320 may comprise material that is different from that of target 324.

Referring now to FIG. 3C, system 300C in accordance with some embodiments is shown that is substantially similar to that of FIG. 3B and operates substantially similar thereto. System 300C, however, may include a plasma ionized chamber 340. The chamber 340 may further include an Ar ion gas. Plasma density near the substrate 330 is increased using the unbalanced magnetic field generated by the mechanically balanced and magnetically unbalanced device 310 and 312. For example, using a plasma ionized chamber 340, the vibrational frequency for targets 320 and 324, e.g., FePt, FePtX, etc., may be changed, e.g., increased, enabling a stable ordering of the atoms at a much lower temperature. As such, the magnetic field is extended toward the substrate 330 and increases the ionization of the sputter species. As such, the temperature for achieving proper ordering for deposition of the targets 320 and 324 on different sides of the substrate 330 may be reduced. In some embodiments the temperature may be reduced by 120° C. while in other embodiments higher temperature reduction of 170° C. may be achieved.

Referring now to FIGS. 4A-4B, an exemplary top and side views of unsymmetrical but mechanically balanced and magnetically unbalanced device 400 with different dimension magnets according to one aspect of the present embodiments are shown. The device 400 is substantially similar to those described in FIGS. 1A-1B and 2A-2B. However, in this embodiment, the holes and magnets are configured such that they are positioned unsymmetrically within the housing 410 and they are not equidistance apart. In order to achieve a mechanically balanced structure magnets and holes with different dimensions may be used. For example, magnets 432-434 and holes 422-424 within the housing 410 may be similar to one another with similar dimensions. However, in order to achieve a mechanically balanced structure, the hole 426 is positioned within the housing to create asymmetry. The hole 426 has dimensions that are greater than the dimensions of holes 422 or 424, e.g., the diameter of hole 426 may be greater than diameter of hole 422 or 424, the depth of the hole 426 may be greater than the depth of hole 422 or 424, or any combination thereof. As such, magnet 436 that also has dimensions that are greater than the dimensions of the magnets 432 or 434 is positioned within the hole 426 creates a mechanically balanced structure even though the holes 422-426 and magnets 432-436 are unsymmetrical.

Referring now to FIG. 5A-5B, another exemplary top and side views of unsymmetrical but mechanically balanced and magnetically unbalanced device 500 with same dimension magnets and different mass according to one aspect of the present embodiments are shown. Device 500 is similar to those described in FIGS. 1A-1B, 2A-2B, and 4A-4B. However, in this embodiment, the holes and magnets are configured such that they are positioned unsymmetrically within the housing 510 and they are not equidistance apart. In order to achieve a mechanically balanced structure magnets and holes with the same dimensions may be used but the magnets may be composed of different material. For example, magnets 532-534 may be similar to one another with similar dimensions but magnet 536 may be composed of heaver material in comparison to magnets 532 or 534 such that mechanically balanced structure is achieved even though the holes 522-526 and magnets 532-536 are unsymmetrical within the housing 510.

Figure 6A:
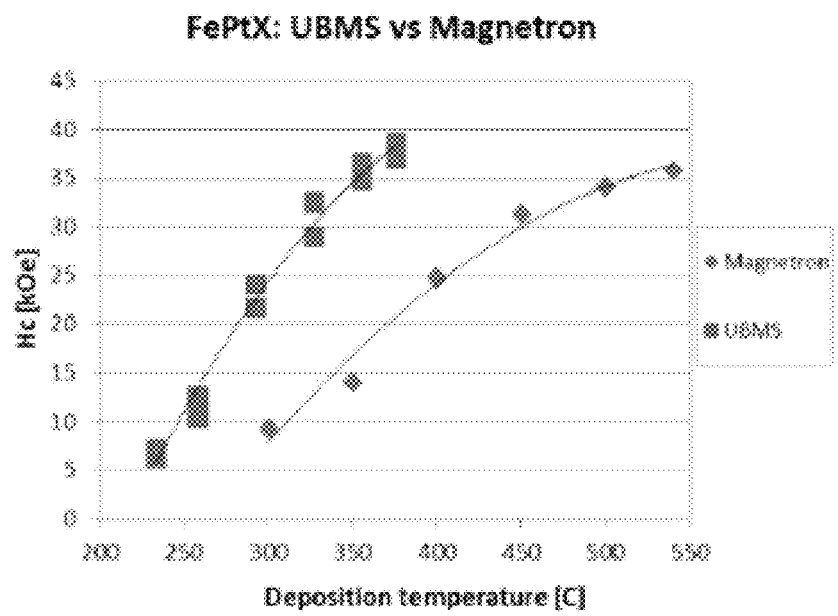
FIGS. 6A-6B show a simulation results according to one aspect of the present embodiments.
Figure 6B:
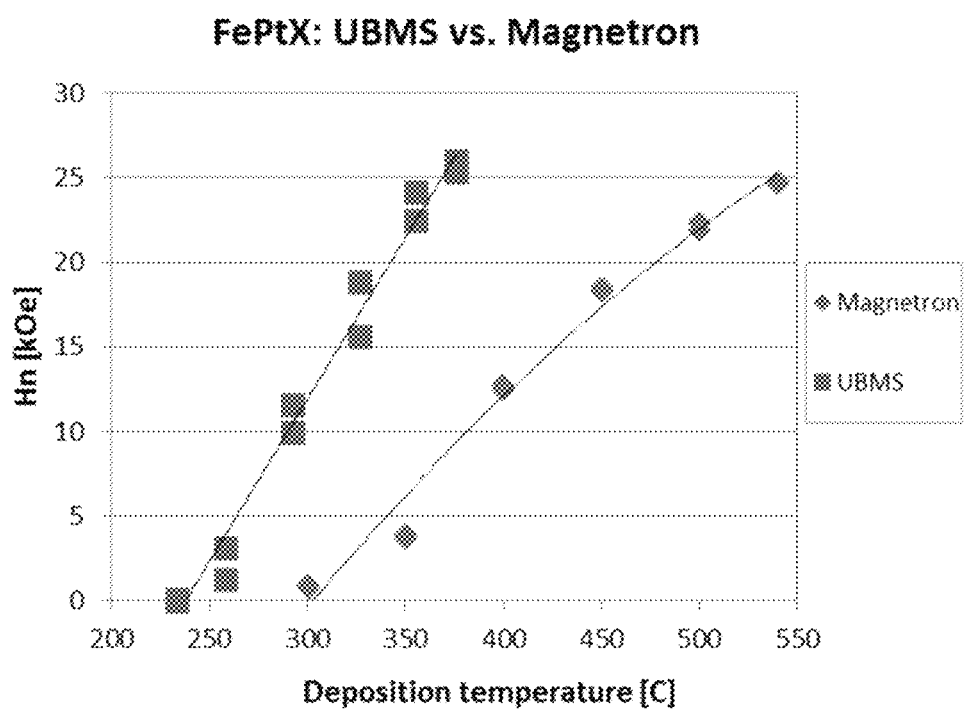

Referring now to FIG. 6A-6B, a simulation results according to one aspect of the present embodiments are shown. As illustrated the deposition temperature for depositing FePtX may be greatly reduced for a given coercivity of FePtX when comparing the conventional magnetron system to the unbalanced magnetic and mechanically balanced (UBMS) structure, as shown in FIG. 6A. As illustrated in FIG. 6B, the deposition temperature for depositing FePtX may be greatly reduced for a given external field when comparing the conventional magnetron system to the UBMS system.

Figure 7A:
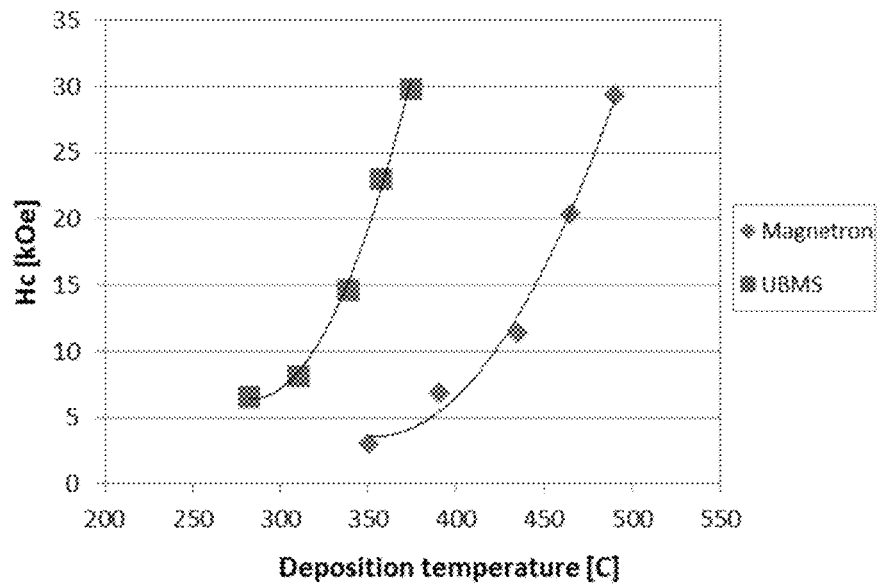
FIGS. 7A-7B show another simulation results according to one aspect of the present embodiments.
Figure 7B:
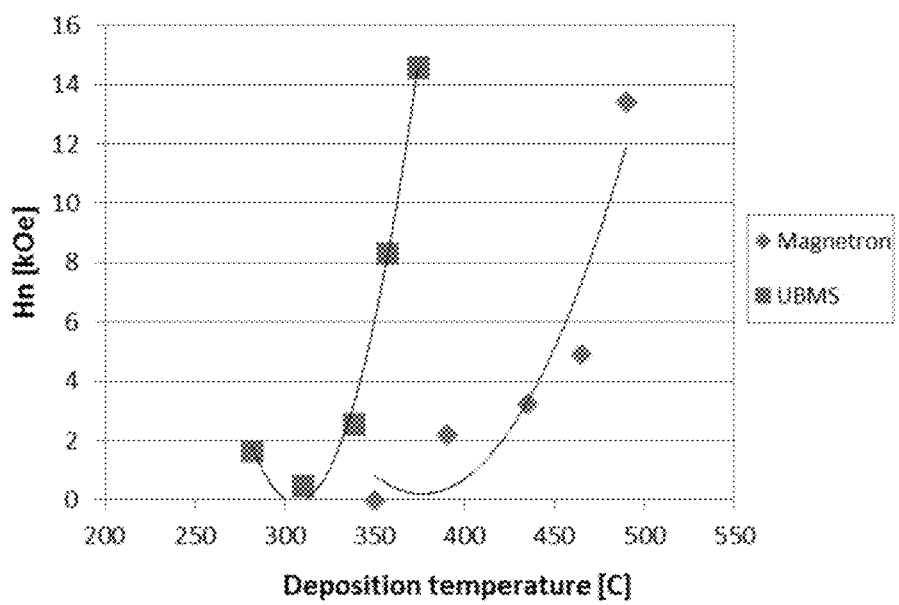
Figure 8A:
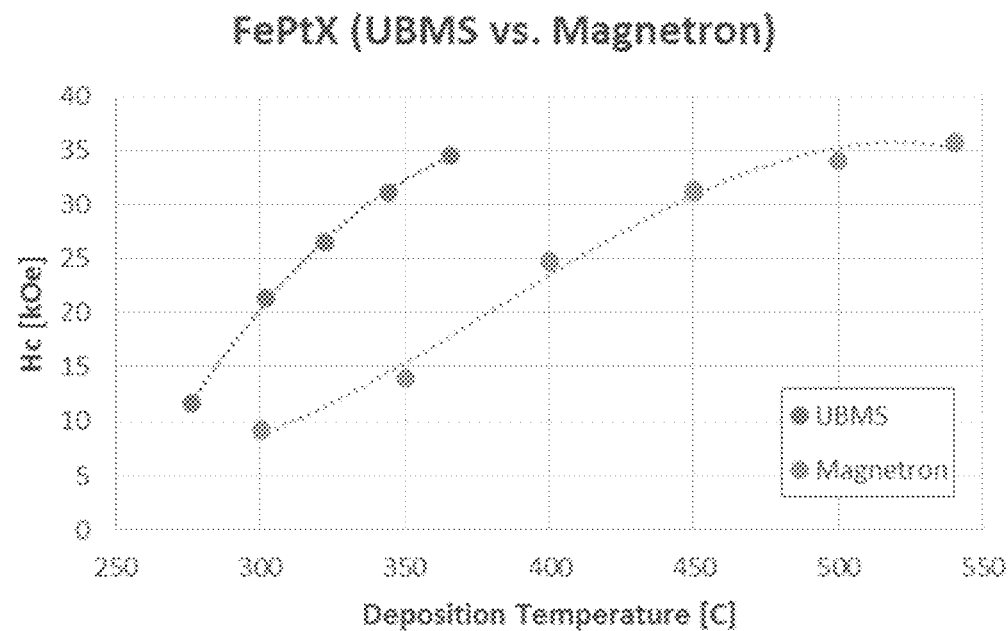
FIGS. 8A-8B show yet another simulation results according to one aspect of the present embodiments.
Figure 8B:
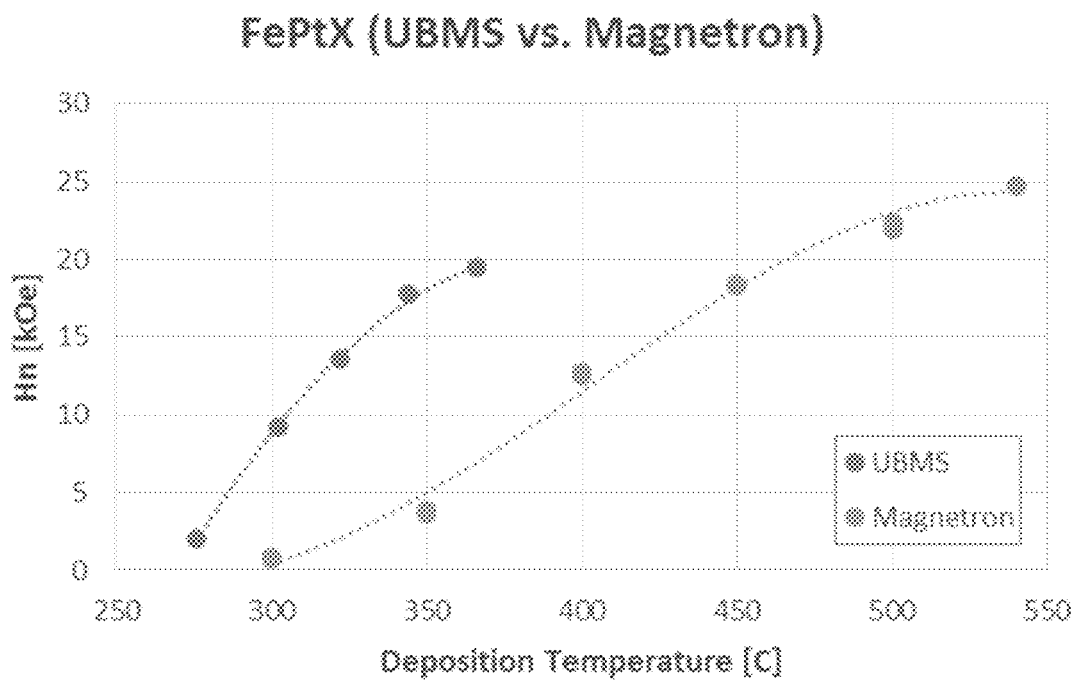

Referring now to FIG. 7A-7B, another simulation results according to one aspect of the present embodiments are shown. Referring now to FIG. 8A-8B, yet another simulation results according to one aspect of the present embodiments are shown.

Figure 9:
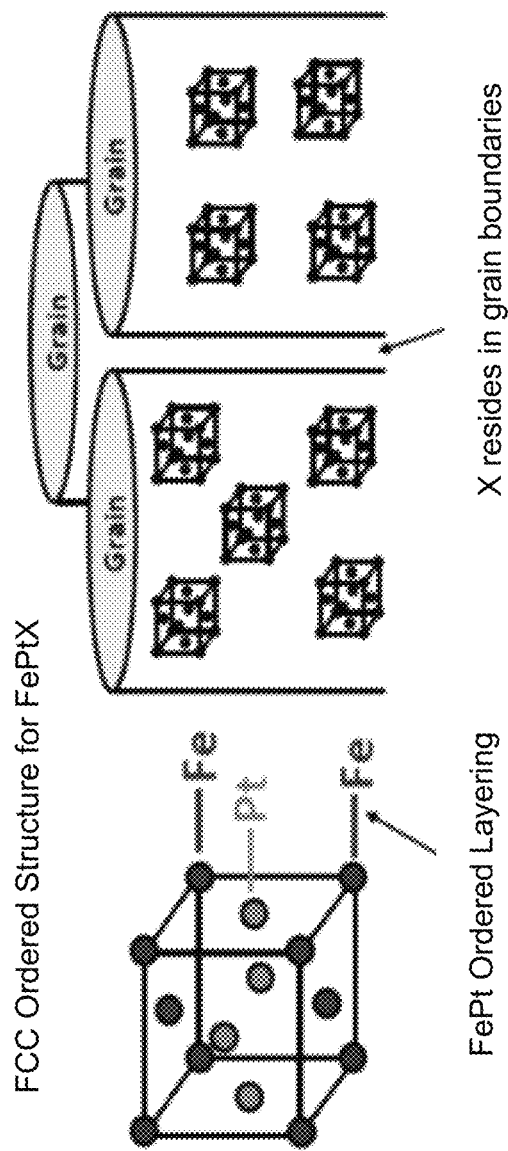
FIG. 9 shows a lattice structure after it has been ordered using a mechanically balanced and magnetically unbalanced device according to one aspect of the present embodiments.

Referring now to FIG. 9, a lattice structure after it has been ordered using a mechanically balanced and magnetically unbalanced device according to one aspect of the present embodiments are shown. As illustrated, FePtX is FCC ordered into grains. The grains including FePt may be separated using sergeants X, where X may include materials such as B, C, SiC, BC, TiC, TaC, BN, SiN, TiN, $SiO_2$, $B_2O_3$, $WO_3$, $Ta_2O_5$, and/or $TiO_2$, forming grain boundaries.

Accordingly, a mechanically balanced and magnetically unbalanced device may be used to reduce the required temperature to achieve deposition of FePtX in an ordered structure on a substrate. Moreover, it is appreciated that a plasma ionized chamber may be used to further reduce the required temperature.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A system comprising:
    a first mechanically balanced and magnetically unbalanced device comprising:
        a first housing unit comprising a first plurality of holes therein; and
        a first plurality of magnets positioned in the first plurality of holes, wherein the first plurality of magnets have a same pole orientation, wherein the first plurality of magnets positioned in the first plurality of holes form a mechanically balanced and magnetically unbalanced structure about a first center axis running perpendicular to the first housing unit and equidistant from the first plurality of holes;
    a substrate; and
    a first target positioned between the substrate and the first mechanically balanced and magnetically unbalanced device, wherein the first mechanically balanced and magnetically unbalanced device is configured to cause atoms from the first target to deposit on a surface of the substrate facing the first target.

2. The system of claim 1 further comprising:
    a second mechanically balanced and magnetically unbalanced device comprising:
        a second housing unit comprising a second plurality of holes therein; and
        a second plurality of magnets positioned in the second plurality of holes, wherein the second plurality of magnets have a same pole orientation, wherein the second plurality of magnets positioned in the second plurality of holes form a mechanically balanced and magnetically unbalanced structure about a second center axis running perpendicular to the second housing unit and equidistant from the second plurality of holes; and
    a second target positioned between another surface of the substrate and the second mechanically balanced and magnetically unbalanced device, wherein the second mechanically balanced and magnetically unbalanced device is configured to cause atoms from the second target to deposit on the another surface of the substrate facing the second target.

3. The system of claim 2 further comprising:
    a plasma ionized chamber housing the first mechanically balanced and magnetically unbalanced device, the first target, the substrate, the second target, and the second mechanically balanced and magnetically unbalanced device.

4. The system of claim 1, wherein the first target comprises FePt.

5. The system of claim 1, wherein deposition of the atoms from the first target on the surface of the substrate facing the first target occurs at a temperature between 250-350° C.

6. The system of claim 1, wherein the first mechanically balanced and magnetically unbalanced device is stationary with respect to the substrate.

7. The system of claim 1, wherein deposition of the atoms from the first target on the surface of the substrate facing the first target forms a face centered cube ordered structure for a heat assisted magnetic recording (HAMR).

8. The system of claim 1, wherein the first plurality of holes are positioned equidistant from one another about the first center axis, and wherein the first plurality of magnets have a same dimension and composition.

9. The system of claim 1, wherein the first plurality of holes are positioned at unequal distances from one another about the first center axis, and wherein the first plurality of magnets have different dimensions with respect to one another to form the mechanically balanced and magnetically unbalanced structure.

10. The system of claim 1, wherein the first plurality of holes are positioned at unequal distances from one another about the first center axis, and wherein the first plurality of magnets have different masses with respect to one another to form the mechanically balanced and magnetically unbalanced structure.

11. A system comprising:
    a first device that is mechanically balanced and magnetically unbalanced about a first center axis running perpendicular to the first housing unit and equidistant from the first plurality of holes;
    a first target positioned between the first device and a first surface of a substrate;
    a second device that is mechanically balanced and magnetically unbalanced about a second center axis running perpendicular to the second housing unit and equidistant from the second plurality of holes; and
    a second target positioned between the second device and a second surface of the substrate, wherein the first surface and the second surface of the substrate face away from one another, wherein the first device is configured to cause atoms from the first target to deposit on the first surface of the substrate facing the first target, and wherein the second device is configured to cause atoms from the second target to deposit on the second surface of the substrate facing the second target, wherein atom deposition from the first target and the second target occurs at a temperature ranging from 250-350° C., and wherein the first device, the second device, the first target and the second target are stationary with respect to the substrate during atom deposition.

12. The system of claim 11, wherein the first target comprises FePtX, where X is one of Cu, Ag, CuAg, Mo, Co, and Ni.

13. The system of claim 11, wherein deposition of the atoms from the first target on the first surface of the substrate facing the first target forms a face centered cube ordered structure for a heat assisted magnetic recording (HAMR).

14. A device comprising:
   a housing unit comprising a plurality of holes therein; and
   a plurality of magnets positioned in the plurality of holes, wherein the plurality of magnets have a same pole orientation, wherein the plurality of magnets positioned in the plurality of holes form a mechanically balanced and magnetically unbalanced structure about a center axis running perpendicular to the housing unit and equidistant from the plurality of holes.

15. The device of claim 14, wherein the plurality of holes are positioned equidistant from one another about the center axis, and wherein the plurality of magnets have a same dimension and composition.

16. The device of claim 14, wherein the plurality of holes are positioned at unequal distances from one another about the center axis, and wherein the plurality of magnets have different dimensions with respect to one another to form the mechanically balanced and magnetically unbalanced structure.

17. The device of claim 14, wherein holes of the plurality of holes are positioned at unequal distances from one another about the center axis, and wherein the plurality of magnets have different masses with respect to one another to form the mechanically balanced and magnetically unbalanced structure.

18. The device of claim 14, wherein the housing unit and the plurality of magnets are stationary.

19. The device of claim 14, wherein the plurality of holes and the plurality of magnets are arranged in a circular fashion about the center axis.

20. The device of claim 14, wherein the plurality of holes and the plurality of magnets are arranged in two concentric circles about the center axis.

* * * * *